(12) United States Patent
Lee et al.

(10) Patent No.: US 10,512,160 B2
(45) Date of Patent: Dec. 17, 2019

(54) CONDUCTIVE STRUCTURE AND MANUFACTURING METHOD THEREFOR

(71) Applicant: LG CHEM, LTD., Seoul (KR)

(72) Inventors: Ilha Lee, Daejeon (KR); Ki-Hwan Kim, Daejeon (KR); Song Ho Jang, Daejeon (KR); Jin Woo Park, Daejeon (KR); Chan Hyoung Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 85 days.

(21) Appl. No.: 15/571,465

(22) PCT Filed: Jun. 1, 2016

(86) PCT No.: PCT/KR2016/005784
§ 371 (c)(1),
(2) Date: Nov. 2, 2017

(87) PCT Pub. No.: WO2016/195367
PCT Pub. Date: Dec. 8, 2016

(65) Prior Publication Data
US 2019/0159339 A1    May 23, 2019

(30) Foreign Application Priority Data

Jun. 3, 2015  (KR) .................. 10-2015-0078785

(51) Int. Cl.
*H05K 1/02*    (2006.01)
*H05K 1/09*    (2006.01)
(Continued)

(52) U.S. Cl.
CPC .......... *H05K 1/0296* (2013.01); *G06F 3/044* (2013.01); *G06F 3/045* (2013.01); *H05K 1/0274* (2013.01);
(Continued)

(58) Field of Classification Search
CPC .... H05K 1/0296; H05K 1/028; H05K 1/0274; H05K 1/09; H05K 3/10; H05K 3/06; H05K 3/46; H05K 2201/0317; H05K 2201/0104; H05K 2201/09681; H05K 2201/2054; G06F 3/044; G06F 3/045; G06F 3/0412;
(Continued)

(56) References Cited

U.S. PATENT DOCUMENTS 9,766,652 B2     9/2017  Lim et al.
2006/0134436 A1*  6/2006  Maschwitz ............ C03C 17/36
                                                       428/426

(Continued)

FOREIGN PATENT DOCUMENTS

KR       10-1221722 B1     1/2013
KR    10-2013-0073859 A    7/2013
(Continued)

OTHER PUBLICATIONS

Hong (KR2014046944A) provided with Office Action (dated 2014).*
(Continued)

*Primary Examiner* — Roshn K Varghese
(74) *Attorney, Agent, or Firm* — Dentons US LLP

(57) ABSTRACT

The present specification relates to a conductive structure body and a method for manufacturing the same.

14 Claims, 2 Drawing Sheets

(51) Int. Cl.
  *G06F 3/044* (2006.01)
  *G06F 3/045* (2006.01)
  *H05K 3/10* (2006.01)
(52) U.S. Cl.
  CPC ............... *H05K 1/09* (2013.01); *H05K 3/10* (2013.01); *G06F 2203/04112* (2013.01); *H05K 2201/0317* (2013.01)
(58) Field of Classification Search
  CPC . G06F 2203/04112; G06F 2203/04103; G06F 3/041; G02B 1/10
  See application file for complete search history.

(56) References Cited

U.S. PATENT DOCUMENTS

| | | | |
|---|---|---|---|
| 2010/0294535 A1* | 11/2010 | Koezuka | C23C 14/0676 174/126.1 |
| 2013/0140065 A1* | 6/2013 | Koo | G06F 3/041 174/256 |
| 2014/0226092 A1 | 8/2014 | Hwang et al. | |
| 2014/0251429 A1* | 9/2014 | Lim | H01L 31/022466 136/256 |
| 2014/0300836 A1 | 10/2014 | Koo et al. | |
| 2015/0212244 A1* | 7/2015 | Kim | C23C 14/0015 359/885 |
| 2015/0212539 A1* | 7/2015 | Hong | G06F 3/041 345/174 |
| 2015/0313013 A1 | 10/2015 | Kim et al. | |
| 2016/0291712 A1 | 10/2016 | Lim et al. | |

FOREIGN PATENT DOCUMENTS

| | | |
|---|---|---|
| KR | 10-2014-0030075 A | 3/2014 |
| KR | 10-2014-0031617 A | 3/2014 |
| KR | 2014046944 A * | 4/2014 |
| KR | 10-2015-0050475 A | 5/2015 |
| KR | 10-2015-0058088 A | 5/2015 |
| WO | WO2014/035196 A1 * | 3/2014 |

OTHER PUBLICATIONS

Hong (US2015/0212539) provided as translation for Hong (KR2014046944A) (Year: 2015).*
Kim (WO2014035196A1) provided with Office Action (dated 2014).*

* cited by examiner

[Figure 1]
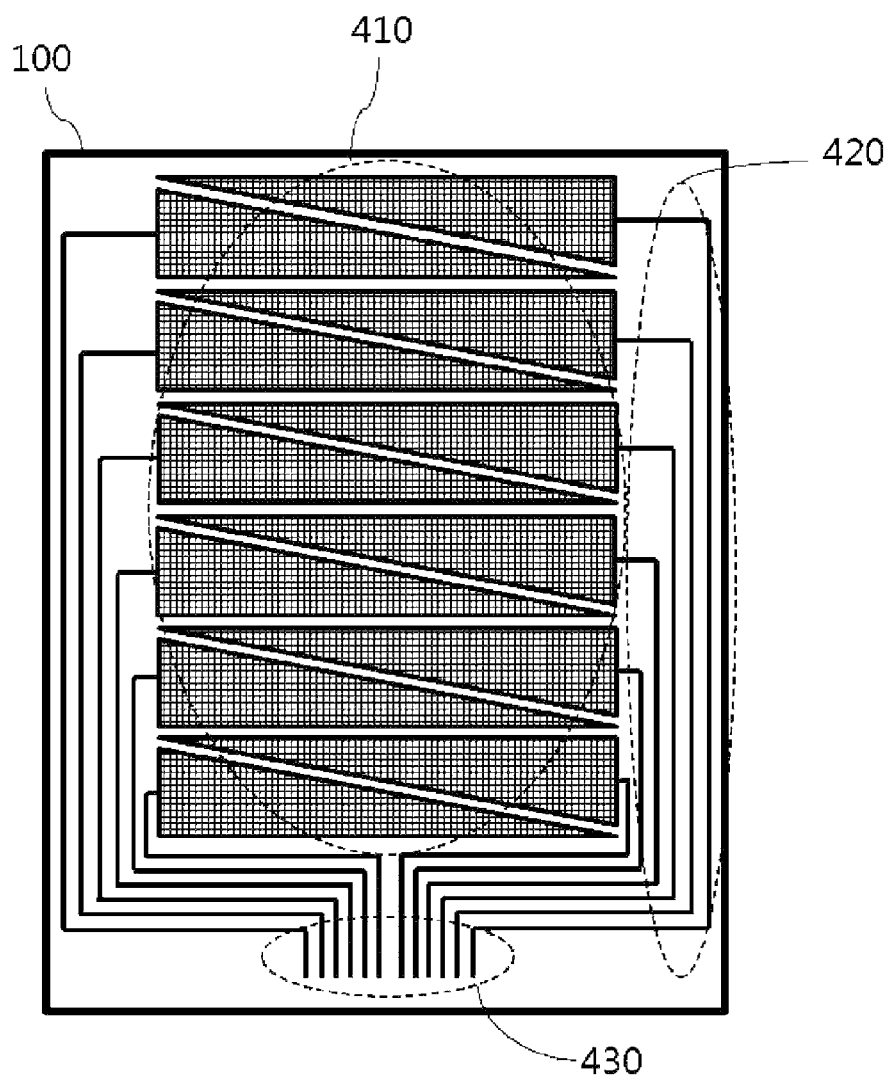

[Figure 2]
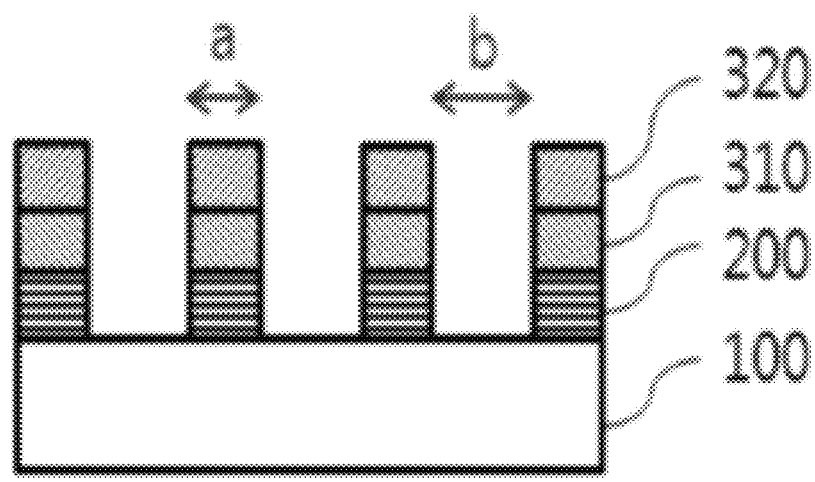
[Figure 3]
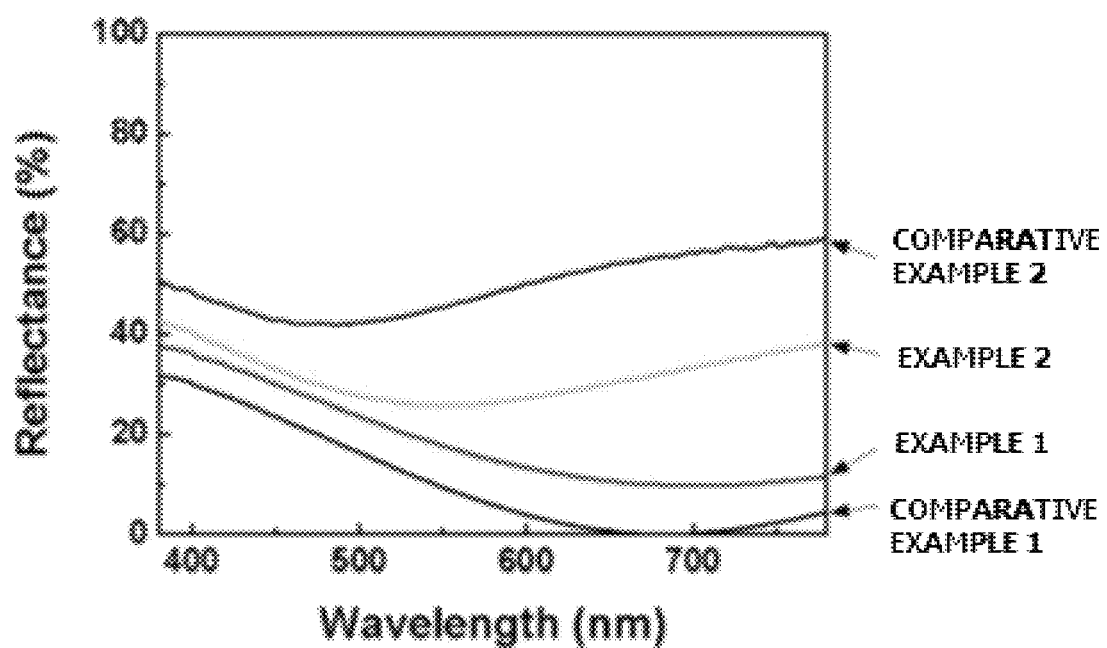

CONDUCTIVE STRUCTURE AND MANUFACTURING METHOD THEREFOR

TECHNICAL FIELD

This application is a National Stage Application of International Application No. PCT/KR2016/005784 filed on Jun. 1, 2016, which claims the benefit of Korean Patent Application No. 10-2015-0078785 filed on Jun. 3, 2015, all of which are hereby incorporated by reference in their entirety for all purposes as if fully set forth herein.

The present specification relates to a conductive structure body and a method for manufacturing the same.

BACKGROUND ART

In general, touch panels may be classified as below according to a detection method of a signal. That is, the detection method includes a resistive type that senses a location pressed by pressure while applying direct current (DC) voltage through a change in current or voltage, a capacitive type using capacitance coupling while applying alternating current (AC) voltage, an electromagnetic type that senses a selected location through the change in voltage while applying a magnetic field, and the like.

Although a commercial touch screen panel is used based on an ITO thin film, when a large-area touch screen panel is applied, a touch recognition speed is slowed due to sheet resistance of an ITO transparent electrode itself. As a result, as a technique for substituting for the transparent ITO thin film, a metal mesh used as an electrode of the touch screen panel is presented. However, in the case of the metal mesh, it is necessary to make efforts to improve an issue on a visibility aspect in which a pattern is visible to a human eye due to high reflectivity, and an issue in that glare occurs due to high reflectance to external light.

DETAILED DESCRIPTION OF THE INVENTION

Technical Problem

An object to be achieved by the present specification is to provide a conductive structure body which can be applied to a large-area touch screen panel, can maintain excellent visibility, and has excellent product reliability due to low connection resistance of a pad part and a method for manufacturing the same.

Technical Solution

An embodiment of the present specification provides a conductive structure body including a substrate; and a conductive line configuring a screen part, a wiring part, and a pad part provided on the substrate, in which the conductive line includes a first metal layer, a light reflection reducing layer provided on the first metal layer, and a second metal layer provided on the light reflection reducing layer, the light reflection reducing layer includes metal oxynitride, and a thickness of the second metal layer is 10 nm or less.

An embodiment of the present specification provides a method for manufacturing the conductive structure body, including: preparing a substrate; forming a first metal layer on the substrate; forming a light reflection reducing layer on the first metal layer; forming a second metal layer on the light reflection reducing layer; patterning of forming a conductive line configuring a screen part, a wiring part, and a pad part by patterning the first metal layer, the light reflection reducing layer, and the second metal layer.

An embodiment of the present specification provides a display device including the conductive structure body.

An embodiment of the present specification provides a touch panel including the conductive structure body.

Advantageous Effects

A conductive structure body according to an embodiment of the present specification has an advantage in maintaining excellent electrical conductivity and effectively preventing a glare effect of a metal layer.

The conductive structure body according to the embodiment of the present specification has an advantage in excellent visibility, and excellent chemical durability and physical durability.

The conductive structure body according to the embodiment of the present specification can minimize a decrease in electrical conductivity of the conductive structure body depending on a process environment when being applied to an electronic element such as a display device.

The conductive structure body according to the embodiment of the present specification can implement a fine line width of a conductive line constituting a screen part to enhance visibility.

The conductive structure body according to the embodiment of the present specification can significantly reduce the connection resistance of a flexible printed circuit board (FPCB) and the conductive line.

BRIEF DESCRIPTION OF DRAWINGS

FIG. 1 illustrates a layout structure of conductive lines in a conductive structure body according to an embodiment of the present specification.

FIG. 2 illustrates a laminated structure of the conductive lines constituting a screen part in the conductive structure body according to the embodiment of the present specification.

FIG. 3 illustrates light reflectivity of the conductive structure body according to examples and comparative examples.

EXPLANATION OF REFERENCE NUMERALS AND SYMBOLS

100: Substrate
200: First metal layer
310: Light reflection reducing layer
320: Second metal layer
410: Conductive lines constituting screen part
420: Conductive lines constituting wiring part
430: Conductive lines constituting pad part

BEST MODE

In the present specification, it will be understood that when a member is referred to as being "on" another member, it can be directly on the other member or intervening members may also be present.

Throughout the specification, unless explicitly described to the contrary, the word "comprise" and variations such as "comprises" or "comprising" will be understood to imply the inclusion of stated elements but not the exclusion of any other elements.

"Conductivity" of the present specification means electrical conductivity.

Further, in the present specification, a "reflectivity" means a light reflectivity, a "refractive index" means a light refractive index", and an "absorptance" means a light absorptance.

The present inventors found problems that when a light reflection reducing layer is formed to prevent a glare phenomenon of a metal mesh for replacing an ITO film, the light reflection reducing layer is provided on a conductive line configuring a pad part connected with a flexible printed circuit board (FPCB), and as a result, contact resistance with the FPCB is increased and further, deterioration of performance of the pad part is caused in a high-temperature and high-humidity environment.

Therefore, the present inventors developed a conductive structure body according to an embodiment of the present specification. Specifically, the conductive structure body according to the embodiment of the present specification may improve performance of the pad part and minimize a defect of the pad part by lowering connection resistance of the conductive line configuring the pad part as well as reducing a glare effect of a conductive line configuring a screen part.

Hereinafter, the present specification will be described in more detail.

An embodiment of the present specification provides a conductive structure body including a substrate; and conductive lines configuring a screen part, a wiring part, and a pad part provided on the substrate, in which the conductive line includes a first metal layer, a light reflection reducing layer provided on the first metal layer, and a second metal layer provided on the light reflection reducing layer, and the light reflection reducing layer contains metal oxynitride and a thickness of the second metal layer is 10 nm or less.

According to the embodiment of the present specification, the thickness of the second metal layer may be less than 10 nm. Specifically, according to the embodiment of the present specification, the thickness of the second metal layer may be 8 nm or less or 6 nm or less.

In the conductive structure body according to the embodiment of the present specification, the light reflection reducing layer serves to reduce the glare effect of the first metal layer. Specifically, since the light reflection reducing layer includes metal oxynitride having a high element content of nitrogen atoms to have a feature that the light reflectivity is significantly low, the glare effect caused by the metal layer provided below the light reflection reducing layer may be suppressed.

According to the embodiment of the present specification, the metal oxynitride of the light reflection reducing layer may be oxynitride originated from at least one metal of Al, Cu, Co, Ag, Mo, Ti, NI, Mn, and Cr. More specifically, the metal oxynitride of the light reflection reducing layer may be aluminum oxynitride.

However, in the case of the light reflection reducing layer, there may be a problem in that the connection resistance of the pad part is high due to low electric conductivity. In order to improve the problem, in a conductive laminate according to an embodiment of the present specification, the second metal layer is provided on the light reflection reducing layer with a thickness of 10 nm or less to lower the connection resistance of the pad part.

Specifically, since the second metal layer has a feature in which the electrical conductivity is high, the feature may contribute to lowering the connection resistance of the pad part. Further, since the second metal layer is provided as a thin film of 10 nm or less to minimize the light reflectivity depending on a metallic characteristic and the second metal layer has higher light transmittance than a general metal layer, a dark color of the lower light reflection reducing layer is not blocked. As a result, the conductive line minimizes light reflection by the second metal to minimize the glare effect in the screen part.

According to the embodiment of the present specification, the light reflection reducing layer may include aluminum oxynitride, in which a value of Equation 1 below may satisfy 1 or more and 2 or less.

$$\frac{3Al_{at\ \%}}{2O_{at\ \%} + 3N_{at\ \%}}$$ [Equation 1]

In Equation 1, $N_{at\ \%}$ means the element content of nitrogen atoms with respect to the aluminum oxynitride, $Al_{at\ \%}$ means the element content of aluminum atoms with respect to the aluminum oxynitride, and $O_{at\ \%}$ means the element content of oxygen atoms with respect to the aluminum oxynitride.

When the value of Equation 1 is larger than 1, an absorption coefficient is increased to form the light reflection reducing layer that may sufficiently prevent the glare effect of the lower metal layer. Further, when the value obtained in Equation 1 is larger than 2, the content of Al is further increased to form a metallic layer and thus, it is difficult to prevent the glare effect of the lower metal layer.

The element content included in the prepared layer may be measured through an X-ray photo electron spectroscopy (XPS). This is a measuring method that may find a composition and a chemical binding state of a sample by measuring energy of photoelectrons emitted by inputting X rays to the surface of the sample.

According to the embodiment of the present specification, a thickness of the light reflection reducing layer may be 10 nm or more and 100 nm or less. Specifically, according to the embodiment of the present specification, the thickness of the light reflection reducing layer may be 20 nm or more and 60 nm or less. More specifically, according to the embodiment of the present specification, the thickness of the light reflection reducing layer may be 30 nm or more and 60 nm or less.

When the thickness of the light reflection reducing layer is less than 10 nm, there is a problem in that high light reflectivity by the first metal layer is not sufficiently decreased. Further, when the thickness of the light reflection reducing layer is more than 100 nm, there may be a problem in that it is difficult to pattern the light reflection reducing layer.

According to the embodiment of the present specification, the second metal layer may include at least one metal of Al, Cu, Co, Ag, Mo, Ti, Ni, Mn, and Cr.

Specifically, according to the embodiment of the present specification, the second metal layer may include aluminum as a main component. Specifically, the second metal layer may be a metal layer made of aluminum.

When the second metal layer contains aluminum as a main component, it is advantageous in that the connection resistance of the conductive line may be significantly decreased even in the thin film having the thickness of 10 nm or less. Further, when the second metal layer contains aluminum as the main component, it is advantageous in that batch-etching is possible by using the same etchant as the light reflection reducing layer including the aluminum oxynitride.

According to the embodiment of the present specification, the light reflectivity of the second metal layer may be 40% or less in the wavelength of 550 nm. Further, according to the embodiment of the present specification, the light reflectivity of the second metal layer may be 50% or less in a wavelength range of 400 nm to 700 nm.

According to the embodiment of the present specification, a specific resistance of the second metal layer may be $10^{-6}$ Ωcm or more and $10^{-4}$ Ωcm or less.

The specific resistance may be measured by measuring sheet resistance of the deposited film and then, multiplying the measured sheet resistance by the thickness according to an equation below.

Specific resistance (Rs)=sheet resistance (ρ)/thickness (t)

Alternatively, the specific resistance value may be directly measured through a hall measurement method.

The second metal layer has a low specific resistance value to largely lower the connection resistance of the conductive line configuring the pad part and thus reduce a defect ratio of the pad part when bonding a flexible printed circuit board (FPCB).

Specifically, the connection resistance of the pad part is calculated by an equation below.

Connection resistance ($R_c$)=contact specific resistance ($ρ_c$)/contact area ($A_c$)

Therefore, the connection resistance of the conductive line configuring the pad part may be determined by the specific resistance of the second metal layer and the contact area of the light reflection reducing layer and the flexible printed circuit board (FPCB) or an anisotropic conductive film (ACF). Therefore, in the second metal layer, a low connection resistance may be implemented even under the same contact area.

According to the embodiment of the present specification, an extinction coefficient k of the conductive line may be 1.2 or more and 2.2 or less in light having a wavelength of 633 nm.

When the extinction coefficient is in the range, concealment of the metal layer is improved and visibility may be further improved when the conductive structure body is applied to a touch screen panel. Further, when the extinction coefficient k of the conductive line is in the range, both the visibility of the conductive line configuring the screen part and the low connection resistance of the conductive line configuring the pad part may be satisfied.

The extinction coefficient may be measured by using an ellipsometer measuring equipment, and the like which are known in the art.

The extinction coefficient k is also called an absorption coefficient and is an element of determining transmittance of the conductive structure body, as a measure capable of defining how strongly the conductive structure body absorbs light in a predetermined wavelength. For example, in the case of a transparent dielectric material, as k<0.2, a k value is very small. However, as a metallic component is increased in the material, the k value is increased. If the metallic component is further increased, the material becomes a metal in which transmittance hardly occurs and only surface reflection mostly occurs, and the extinction coefficient k is more than 2.5 and thus, it is not preferred in the formation of the light reflection reducing layer.

According to the embodiment of the present specification, a refractive index n of the conductive line may be 2 or more and 2.4 or less in the light having a wavelength of 600 nm.

According to the embodiment of the present specification, the light reflectivity of the conductive line may be 40% or less.

According to the embodiment of the present specification, the thickness of the light reflection reducing layer may be determined depending on the refractive index with reference to Equation 1 below.

$$d = \frac{\lambda}{4n} N (N = 1, 3, 5, \ldots)$$ [Equation 1]

In Equation 1, d represents the thickness of the light reflection reducing layer, n represents the refractive index, and λ represents a wavelength of light.

According to the embodiment of the present specification, the total reflectance means a reflectance to light having a wavelength range of 300 nm or more and 800 nm or less, particularly, 380 nm or more and 780 nm or less, which is incident at 90° to the surface to be measured after an opposite surface to the surface to be measured is treated with perfect black. In the present specification, the total reflectance is a value measured based on light at a wavelength range of 300 or more and 800 nm or less and particularly 380 or more and 780 nm or less of reflection light reflected by a target pattern layer or a conductive structure body to which the light is incident when incident light is 100%.

The reflectance may be measured in an opposite direction to a surface of the light reflection reducing layer contacting the first metal layer when the first metal layer is provided between the substrate and the light reflection reducing layer. Specifically, when the light reflection reducing layer includes a first surface contacting the first metal layer and a second surface facing the first surface, the reflectance may be measured in a direction of the second surface.

According to the embodiment of the present specification, the first metal layer may be a first metal pattern layer, the light reflection reducing layer may be a light reflection reducing pattern layer, and the second metal layer may be a second metal pattern layer. In this case, when the total reflectance of the conductive structure body is measured at the second surface side of the light reflection reducing pattern layer, a total reflectance Rt of the conductive structure body may be calculated by Equation 2 below.

Total reflectance $R_t$=reflectance of substrate+closure rate×reflectance of light reflection reducing layer [Equation 2]

Further, when the configuration of the conductive structure body is a case where two types of conductive structure bodies are laminated, the total reflectance ($R_t$) of the conductive structure body may be calculated by Equation 3 below.

Total reflectance $R_t$=reflectance of substrate+closure rate×reflectance of light reflection reducing layer [Equation 3]

In Equations 2 and 3, the total reflectance of the substrate may be a reflectance of touch tempered glass and when the surface is a film, the total reflection may be the reflectance of the film. Further, the closure rate may be represented by an area ratio, that is, (1—aperture ratio) occupied by a region covered by the conductive pattern based on the plane of the conductive structure body.

According to the embodiment of the present specification, the total reflectance of the conductive structure body may be 40% or less. Specifically, according to the embodiment of the present specification, the total reflectance of the screen part in the light in a wavelength range of 380 nm to 780 nm may be 40% or less.

In the present specification, the screen part may mean an area corresponding to a display screen when the conductive structure body is applied to a display device. When the conductive structure body is used as a touch panel, the conductive line configuring the screen part may serve to transfer an electric signal to the conductive line of the wiring part by sensing a touch.

In the present specification, the wiring part may mean an area corresponding to a bezel area of the display device when the conductive structure body is applied to a display device. When the conductive structure body is used as the touch panel, the conductive line configuring the wiring part may serve to transfer the electric signal transferred from the conductive line of the screen part to the conductive line configuring the pad part.

In the present specification, the pad part may mean an area contacting a flexible printed circuit board (FPCB). When the conductive structure body is used as the touch panel, the conductive line configuring the pad part may serve to transfer the electric signal transferred from the wiring part to the FPCB. Further, the pad part may be a FPCB bonding pad part.

FIG. 1 illustrates a layout structure of a conductive line in a conductive structure body according to an embodiment of the present specification. In FIG. 1, the conductive line configuring the screen part is provided to have a mesh pattern, the conductive line configuring the wiring part is provided as a structure which is extended to the conductive line configuring the pad part by using the bezel region, and the conductive line configuring the pad part may form a set of ends of the conductive line. However, the conductive line of the conductive structure body according to the embodiment of the present specification is not limited to the structure of FIG. 1 and may be implemented by various structures.

According to the embodiment of the present specification, a flexible printed circuit board (FPCB) may be further included on the conductive line configuring the pad part.

According to the embodiment of the present specification, the anisotropic conductive film (ACF) may be further included between the conductive line configuring the pad part and the FPCB. Specifically, the conductive line configuring the pad part and the FPCB may be electrically connected to each other through the ACF.

The FPCB has a bending characteristic and means a board in which when circuits between components of an electronic product are connected with each other, a circuit is drawn on the board without using wires to conduct electricity. The FPCB of the present specification may be applied without limitation as long as the FPCB is generally used in the art.

The ACF is a film in which conductive particles are dispersed, and means a film having conductivity in which electricity is applied in a z axis and showing insulation in an x-y plane direction. The ACF of the present specification may be applied without limitation as long as the ACF is generally used in the art.

According to the embodiment of the present specification, the FPCB may be provided to be more adjacent to the second metal layer than the light reflection reducing layer. Specifically, according to the embodiment of the present specification, the ACF is provided on the second light reflection reducing layer in contact with the second light reflection reducing layer and the FPCB may be provided on the ACF in contact with the ACF.

According to the embodiment of the present specification, the screen part may include a conductive pattern including a plurality of openings and the conductive line partitioning the openings.

According to the embodiment of the present specification, the conductive line configuring the screen part may form a regular pattern or an irregular pattern. Specifically, the conductive line configuring the screen part may be provided by forming a pattern on the transparent substrate through a patterning process.

Specifically, the pattern may have a polygon such as a triangle and a quadrangle, a circle, an ellipse, or an amorphous shape. The triangle may be a regular triangle, a right-angled triangle, or the like and the quadrangle may be a square, a rectangle, a trapezoid, or the like.

As the regular pattern, a pattern form in the art such as a mesh pattern may be used. The irregular pattern is not particularly limited, but may be a boundary line form of figures configuring a Voronoi diagram. According to the embodiment of the present specification, in the case of using the irregular pattern as the pattern form, a diffractive pattern of reflective light by oriented lighting may be removed by the irregular pattern and an effect by scattering of light may be minimized by the light reflection reducing pattern layer, and as a result, the problem in the visibility may be minimized.

According to the embodiment of the present specification, a line width of the conductive line configuring the screen part may be 0.1 μm or more and 100 μm or less. Specifically, according to the embodiment of the present specification, the line width of the conductive line configuring the screen part may be 0.1 μm or more and 50 μm or less, 0.1 μm or more and 30 μm or less, or 0.1 μm or more and 10 μm or less, but is not limited thereto. The line width of the conductive line configuring the screen part may be designed according to a final use of the conductive structure body.

When the line width of the conductive line configuring the screen part is less than 0.1 μm, it is difficult to implement the pattern, and when the line width is more than 100 μm, the visibility may be deteriorated.

The light reflection reducing layer may have a pattern having the same shape as the first metal layer. However, a pattern scale of the light reflection reducing layer needs not to be completely the same as that of the first metal layer, and even a case where the line width of the pattern in the light reflection reducing layer is smaller than or larger than the line width of the pattern in the first metal layer is included in the range of the present specification. Specifically, the line width of the pattern in the light reflection reducing layer may be 80% or more and 120% or less of the line width of the pattern in the first metal layer. Further, an area provided with the pattern in the light reflection reducing layer may be 80% or more and 120% or less of an area provided with the pattern in the first metal layer. More particularly, the pattern form of the light reflection reducing layer may be a pattern form having a line width which is equal to or larger than the line width of the pattern in the first metal layer.

When the light reflection reducing layer has a pattern shape having a line width which is larger than the line width of the first metal layer, when viewed from the user, the light reflection reducing layer may largely give an effect of covering the first metal layer, and thus, there is an advantage in that an effect by luster or reflection of the first metal layer itself may be efficiently blocked. However, even though the line width of the pattern in the light reflection reducing layer is the same as the line width of the pattern in the first metal layer, an effect of reducing the light reflection may be achieved.

According to the embodiment of the present specification, a line gap between adjacent conductive lines in the conductive line configuring the screen part may be 0.1 μm or more and 100 μm or less.

According to the embodiment of the present specification, the line gap may be 0.1 μm or more, more particularly 10 μm or more, and much more particularly 20 μm or more. Further, according to the embodiment of the present specification, the line gap may be 100 μm or less and more particularly 30 μm or less.

According to the embodiment of the present specification, since the first metal layer, the light reflection reducing layer, and the second metal layer may be implemented by patterns having fine line widths, in the case of being used as an electrode of the touch panel of the display element, there is an advantage in that visibility is excellent.

FIG. 2 illustrates a laminated structure of a conductive line of a screen part in the conductive structure body according to the embodiment of the present specification. In FIG. 2, it is illustrated that a substrate, a patterned first metal layer, a patterned light reflection reducing layer, and a patterned second metal layer are sequentially provided. However, the conductive structure body is not limited to the structure of FIG. 2, but additional layers may be further included.

In FIG. 2, a means the line width of the conductive line, and b means a line gap between adjacent conductive lines.

According to the embodiment of the present specification, the first metal layer may include at least one selected from a group consisting of at least one metal of copper, aluminum, silver, neodymium, molybdenum, nickel and chromium, alloys including at least two of the metals, oxides including at least one of the metals, and nitrides including at least one of the metals. Specifically, according to the embodiment of the present specification, the first metal layer may include aluminum. According to the embodiment of the present specification, the first metal layer may be made of aluminum. Further, according to the embodiment of the present specification, the first metal layer may include aluminum as the main component. However, due to a manufacturing process, some of impurities may be included.

According to the embodiment of the present specification, a thickness of the first metal layer may be 10 nm or more and 1 μm or less. Specifically, according to the embodiment of the present specification, the thickness of the first metal layer may be 100 nm or more and more particularly 150 nm or more. Further, according to the embodiment of the present specification, the thickness of the first metal layer may be 500 nm or less and more particularly, 200 nm or less. Since the electric conductivity depends on the thickness, if the first metal layer is very thin, a continuous thickness is not formed and thus there is a problem in that the specific resistance value is increased, and as a result, the thickness of the first metal layer may be 100 nm or more.

According to the embodiment of the present specification, an additional metal layer may be further included between the transparent conductive layer and the first metal layer.

According to the embodiment of the present specification, the additional metal layer may include two or more metals selected from a group consisting of copper, aluminum, neodymium, molybdenum, titanium, nickel and chromium. Specifically, the additional metal layer may include Cu—Ni.

The additional metal layer may serve to minimize deterioration of electrical conductivity of the conductive structure body and improve adhesion between the transparent conductive layer and the first metal layer.

According to the embodiment of the present specification, the substrate is not particularly limited and may use a material which is known in the art. According to the embodiment of the present specification, the transparent substrate may use any transparent substrate, and for example, may be glass, polyethylene terephthalate (PET), polycarbonate (PC) or polyamide (PA).

According to the embodiment of the present specification, the transparent conductive layer may be further provided between the transparent substrate and the first metal layer.

According to the embodiment of the present specification, a transparent conductive oxide layer may be used as the transparent conductive layer. The transparent conductive oxide may use indium oxide, zinc oxide, indium tin oxide, indium zinc oxide, indium zinc tin oxide, an amorphous transparent conductive polymer, etc., and use one kind or all of two kinds or more thereof, but is not limited thereto. According to the embodiment of the present specification, the transparent conductive layer may be an indium tin oxide layer.

According to the embodiment of the present specification, the thickness of the transparent conductive layer may be 15 nm or more and 20 nm or less, but is not limited thereto. The transparent conductive layer may be formed by using the aforementioned material for the transparent conductive layer through an evaporation process or a printing process.

An embodiment of the present specification provides a manufacturing method of the conductive structure body.

An embodiment of the present specification provides a method for manufacturing the conductive structure body including: preparing a substrate; forming a first metal layer on the substrate; forming a light reflection reducing layer on the first metal layer; forming a second metal layer on the light reflection reducing layer; and patterning of forming a conductive line configuring a screen part, a wiring part, and a pad part by patterning the first metal layer, the light reflection reducing layer, and the second metal layer.

According to the embodiment of the present specification, in the forming of the first metal layer, the first metal layer may be formed on one surface of the substrate as an entire layer.

According to the embodiment of the present specification, in the forming of the light reflection reducing layer, the light reflection reducing layer may be formed on one surface of the first metal layer as an entire layer.

According to the embodiment of the present specification, in the forming of the second metal layer, the second metal layer may be formed on one surface of the light reflection reducing layer as the entire layer.

According to the embodiment of the present specification, the first metal layer of the forming of the first metal layer may mean the first metal layer formed as the entire layer before being patterned with the conductive line.

According to the embodiment of the present specification, the light reflection reducing layer of the forming of the light reflection reducing layer may mean the light reflection reducing layer formed as the entire layer before being patterned with the conductive line.

According to the embodiment of the present specification, the second metal layer of the forming of the second metal layer may mean the second metal layer formed as the entire layer before being patterned with the conductive line.

The entire layer may mean one physically continuous side or film which is formed on an area of 80% or more of one surface of a lower member formed with a target member. Specifically, the entire layer may mean one layer before being patterned.

According to the embodiment of the present specification, the forming of the first metal layer, the forming of the first light reflection reducing layer, and the forming of the second metal layer may adopt methods such as evaporation, sputtering, wet coating, evaporation, electroplating or electroless plating, lamination of a metal film, and the like. Specifically, according to the embodiment of the present specification, the forming of the first metal layer, the forming of the light reflection reducing layer, and the forming of the second metal layer may adopt an evaporation or sputtering method, respectively.

Further, according to the embodiment of the present specification, the forming of the first metal layer, the forming of the light reflection reducing layer, and the forming of the second metal layer may adopt a printing method. In the case of forming the first metal layer, the light reflection reducing layer, and the second metal layer by the printing method, ink or paste including a metal may be used, and the paste may further include a binder resin, a solvent, a glass frit, and the like in addition to the metal.

According to the embodiment of the present specification, in the patterning, the first metal layer, the light reflection reducing layer, and the second metal layer may be simultaneously patterned.

According to the embodiment of the present specification, the patterning may use a material having an etching resist characteristic. The etching resist may form a resist pattern by using a printing method, a photolithography method, a photography method, a dry film resist method, a wet resist method, a method using a mask or laser transfer, for example, thermal transfer imaging, and the like, and particularly, a dry film resist method may be used. However, the etching resist is not limited thereto. The first metal layer, the light reflection reducing layer, and the second metal layer are etched and patterned by using the etching resist pattern and the etching resist pattern may be easily removed by a strip process.

According to the embodiment of the present specification, in the patterning, the first metal layer, the light reflection reducing layer, and the second metal layer may be batch-etched by using the etchant.

In the manufacturing method according to the embodiment of the present specification, when the first metal layer, the light reflection reducing layer, and the second metal layer include the same kind of metal, since the first metal layer, the light reflection reducing layer, and the second metal layer may be etched using the same etchant, there is an advantage in that the first metal layer, the light reflection reduction layer, and the second metal layer may be batch-etched. Specifically, according to the embodiment of the present specification, the first metal layer, the light reflection reducing layer, and the second metal layer include Al, respectively, and the etchant may be an Al etchant, and etchants which are generally used in the art may be used without limitation.

An embodiment of the present specification provides a display device including the conductive structure body.

An embodiment of the present specification provides a touch panel including the conductive structure body. The touch panel includes the same meaning as a touch screen panel. For example, in a capacitive touch panel, the conductive structure body according to the embodiment of the present specification may be used as a touch sensitive electrode substrate.

Further, an embodiment of the present specification provides a display device including the touch panel.

In this specification, a display device collectively refers to a TV, a computer monitor, or the like and includes a display element forming images and a case supporting the display element.

The touch screen panel according to the embodiment of the present specification may further include an additional structure body other than the aforementioned conductive structure body. In this case, two structure bodies may be disposed in the same direction, or may be disposed in directions opposite to each other. Two or more structure bodies that may be included in the touch screen panel need not to have the same structure, and any one, preferably, only the structure body closest to the user may include the aforementioned conductive structure body, and an additional structure body may not include the light reflection reducing layer. Further, layer-laminated structures in the two or more structure bodies may be different from each other. When two or more structure bodies are included, an insulating layer may be provided therebetween. In this case, the insulating layer may additionally have a function as an adhesive layer.

The touch screen panel according to the embodiment of the present specification may include a lower substrate; an upper substrate; and an electrode layer provided on any one surface or two surfaces of a surface of the lower substrate contacting the upper substrate and a surface of the upper substrate contacting the lower substrate. The electrode layers may perform a function for detecting an X-axial position and a Y-axial position, respectively.

In this case, one or both of the electrode layer provided on the lower substrate and the surface of the lower substrate contacting the upper substrate; and the electrode layer provided on the upper substrate and the surface of the upper substrate contacting the lower substrate may be the conductive structure body according to the aforementioned embodiment of the present specification. In the case where only one of the electrode layers is the conductive structure body according to the embodiment of the present specification, the other electrode layer may have a conductive pattern which is known in the art.

In the case where the electrode layers are provided on one side surface of each of both the upper substrate and the lower substrate to form an electrode layer of the two layers, an insulating layer or a spacer may be provided between the lower substrate and the upper substrate so that a distance between the electrode layers is uniformly maintained and the electrode layers are not connected to each other. The insulating layer may include an adhesive or a UV or thermosetting resin. The touch screen panel may further include a ground portion connected to the pattern of the conductive layer of the aforementioned conductive structure body. For example, the ground portion may be formed at an edge of the surface with the pattern of the conductive layer of the substrate. Further, at least one of an anti-reflective film, a polarization film, and an anti-fingerprinting film may be provided on at least one surface of a laminate including the conductive structure body. According to a design specification, different kinds of functional films may further be included in addition to the aforementioned functional films. As described above, the touch screen panel may be applied to display devices such as an OLED display panel, a liquid crystal display (LCD), a cathode-ray tube (CRT), and a PDP.

In the touch screen panel according to the embodiment of the present specification, the conductive pattern layer and the light reflection reducing layer may be provided on two surfaces of the substrate, respectively.

The touch screen panel according to the embodiment of the present specification may additionally include an electrode portion or a pad part on the conductive structure body. In this case, an effective screen part, the electrode portion, and the pad part may be configured by the same conductive body.

In the touch screen panel according to the embodiment of the present specification, the light reflection reducing layer may be provided at a side viewed by the user.

An embodiment of the present specification provides a display device including the conductive structure body. In the display device, the conductive structure body according to the embodiment of the present application may be used in a color filter substrate, a thin film transistor substrate, or the like.

An embodiment of the present specification provides a solar cell including the conductive structure body. For example, the solar cell may include an anode electrode, a cathode electrode, a photoactive layer, a hole transporting layer and/or an electron transporting layer, and the conductive structure body according to the embodiment of the present application may be used as the anode electrode and/or the cathode electrode.

The conductive structure body may replace conventional ITO in the display device or the solar cell and may be used as a flexible application. Further, the conductive structure body may be used as a next-generation transparent electrode together with CNT, a conductive polymer, graphene, or the like.

Hereinafter, the present specification will be described in detail with reference to Examples for a specific description. However, the Examples according to the present specification may be modified in various forms, and it is not interpreted that the scope of the present specification is limited to the Examples described below. The Examples of the present specification will be provided for more completely explaining the present specification to those skilled in the art.

Mode for Invention

A first metal layer having a thickness of 100 nm was formed by using aluminum on a polyethylene terephthalate (PET) substrate. A conductive structure body is manufactured by forming a light reflection reducing layer made of aluminum oxynitride on the first metal layer with a thickness of 60 nm and forming a second metal layer on the light reflection reducing layer by using a roll-to-roll sputtering method. The conductive structure bodies according to an example and a comparative example was manufactured as shown in Table 1 below by controlling an intensity of magnetron (MF) of an R2R sputter and controlling a thickness of the second metal layer.

For reference, in the example and the comparative example, patterning for forming a conductive line was omitted.

TABLE 1

| | Sheet resistance ($\Omega/\square$) | Specific resistance ($\Omega \cdot cm$) | Thickness of second metal layer (nm) |
|---|---|---|---|
| Comparative Example 1 | — | — | 0 |
| Example 1 | 470 | $3.8 \times 10^{-4}$ | 8 |
| Example 2 | 36 | $3.6 \times 10^{-5}$ | 10 |
| Comparative Example 2 | 17 | $2.0 \times 10^{-5}$ | 12 |

FIG. 3 illustrates a light reflectivity of the conductive structure bodies according to the examples and the comparative examples.

According to Table 1 and FIG. 3 above, it can be seen that when the thickness of the second metal layer is 10 nm or less, an effect of a lower light reflection reducing layer may be maintained and a glare effect by light reflection of the surface of the conductive structure body may be suppressed. Further, since the sheet resistance and the specific resistance are decreased by the second metal layer, it is possible to reduce a defective rate of a pad part when bonding a flexible printed circuit board (FPCB).

The invention claimed is:

1. A conductive structure body comprising:
a substrate; and
a conductive line configuring a screen part, a wiring part, and a pad part provided on the substrate,
wherein the conductive line includes a first metal layer, a light reflection reducing layer provided on the first metal layer, and a second metal layer provided on the light reflection reducing layer,
wherein the light reflection reducing layer includes metal oxynitride, and
wherein a thickness of the second metal layer is 6 nm or more and less than 10 nm,
wherein the screen part includes a conductive pattern including a plurality of openings and the conductive line partitioning the openings, and
wherein a line gap between adjacent conductive lines in the conductive line configuring the screen part is 0.1 µm or more and 100 µm or less; and
wherein a thickness of the first metal layer is 10 nm or more and 1 µm or less.

2. The conductive structure body of claim 1, wherein the metal oxynitride is aluminum oxynitride.

3. The conductive structure body of claim 2, wherein in the aluminum oxynitride, a value of Equation 1 below satisfies 1 or more and 2 or less:

$$\frac{3Al_{at\,\%}}{2O_{at\,\%} + 3N_{at\,\%}} \quad \text{[Equation 1]}$$

in Equation 1, $N_{at\,\%}$ means the element content of nitrogen atoms with respect to the aluminum oxynitride, $Al_{at\,\%}$ means the element content of aluminum atoms with respect to the aluminum oxynitride, and $O_{at\,\%}$ means the element content of oxygen atoms with respect to the aluminum oxynitride.

4. The conductive structure body of claim 1, wherein the second metal layer includes at least one metal of Al, Cu, Co, Ag, Mo, Ti, Ni, Mn, and Cr.

5. The conductive structure body of claim 1, wherein a light reflectivity of the second metal layer is 40% or less in a wavelength of 550 nm.

6. The conductive structure body of claim 1, wherein the light reflectivity of the conductive line is 40% or less.

7. The conductive structure body of claim 1, wherein a specific resistance of the second metal layer is $10^{-6}$ Ωcm or more and $10^{-4}$ Ωcm or less.

8. The conductive structure body of claim 1, further comprising:
   a flexible printed circuit board (FPCB) on the conductive line configuring the pad part.

9. The conductive structure body of claim 8, further comprising:
   an anisotropic conductive film (ACF) between the conductive line configuring the pad part and the FPCB.

10. The conductive structure body of claim 1, wherein a line width of the conductive line configuring the screen part is 0.1 μm or more and 100 μm or less.

11. A method for manufacturing a conductive structure body of claim 1, the method comprising:
   preparing a substrate;
   forming a first metal layer on the substrate;
   forming a light reflection reducing layer on the first metal layer;
   forming a second metal layer on the light reflection reducing layer;
   forming a conductive line configuring a screen part, a wiring part, and a pad part by patterning the first metal layer, the light reflection reducing layer, and the second metal layer, wherein a thickness of the second metal layer is 6 nm or more and less than 10 nm, and
   wherein the screen part includes a conductive pattern including a plurality of openings and the conductive line partitioning the openings, and
   wherein a line gap between adjacent conductive lines in the conductive line configuring the screen part is 0.1 μm or more and 100 μm or less; and
   wherein a thickness of the first metal layer is 10 nm or more and 1 μm or less.

12. The method of claim 11, wherein in the patterning, the first metal layer, the light reflection reducing layer, and the second metal layer are simultaneously patterned.

13. A display device comprising the conductive structure body of claim 1.

14. A touch panel comprising the conductive structure body of claim 1.

* * * * *